United States Patent [19]

Fiorito et al.

[11] 4,217,490
[45] Aug. 12, 1980

[54] METHOD FOR CONSTRUCTING MULTISPECTRAL INFRARED DETECTORS

[75] Inventors: Giancarlo Fiorito, Albenga; Guido Gasparrini, Treviglio; Francesco Svelto, Segrate, all of Italy

[73] Assignee: CISE - Centro Informazioni Studi Esperienze S.p.A., Milan, Italy

[21] Appl. No.: 931,088

[22] Filed: Aug. 4, 1978

[30] Foreign Application Priority Data

Dec. 6, 1977 [IT] Italy .................. 30501 A/77

[51] Int. Cl.$^2$ .................. H01J 39/12; H01L 25/02
[52] U.S. Cl. .................. 250/211 J; 29/572; 357/30
[58] Field of Search .................. 29/572; 357/30; 250/211 S

[56] References Cited

U.S. PATENT DOCUMENTS

| 4,104,789 | 8/1978 | Robillard | 29/572 |
|---|---|---|---|
| 4,132,999 | 2/1979 | Maillé | 357/30 |
| 4,157,926 | 6/1979 | Schoolar | 29/572 |

Primary Examiner—W. C. Tupman
Attorney, Agent, or Firm—Karl W. Flocks

[57] ABSTRACT

This invention relates to a method for constructing multispectral infrared detectors formed by three HgCdTe photovoltaic elements disposed in the form of a sandwich. According to the invention, each photovoltaic element is constructed by preparing a suitable slice of HgCdTe, by polishing the faces of said slice, by chemically attacking the slice, by heating the slice in the presence of mercury inside a test tube within a furnace having a suitable temperature profile, by constructing the ground contact by catalytic deposition of gold, by cementing the slice onto a support, by depositing a layer of photoresist on the slice, by masking the photoresist with the exception of a small exposure region, by eliminating the photoresist in the exposure region, by grafting the slice and by depositing the upper contact and an entire flecting layer. The individual elements are finally assembled and electrically connected to output terminals.

3 Claims, 5 Drawing Figures

METHOD FOR CONSTRUCTING MULTISPECTRAL INFRARED DETECTORS

This invention relates to a method for constructing multispectral infrared detectors.

The photographic or television reproduction of a scene, an object etc., can notably be obtained either by active systems in which they are illuminated with light, and generally sunlight, or by passive systems, utilising the radiation emitted by the body itself.

The characteristics of the reproduced image also notably depend in the first case not only on the sensor (photographic paper, cathode ray tube, semiconductor radiation detectors etc.), but also essentially on the characteristics of the light source and the reflectivity of the object under consideration.

In the second case these characteristics depend not only on the sensor, but also on the spectral distribution of the emitted radiation. This in its turn is a function of the body temperature and emissivity.

When the temperature of the object is such that the maximum emissivity is infrared, these images are known as "thermal", and the reproduction technique is known as "thermography". Thus, an image can be obtained by utilising either wide ranges of the reflected or emitted electromagnetic spectrum, or narrower parts of it (bands or channels), depending on the spectrum region in which the sensor is active.

Thus a normal colour photograph is generally obtained by utilising all wavelengths of the reflected light, but there is nothing to prevent the use of selective filters to obtain the information contained in one particular wavelength (colour), and this is in fact done in photography for scientific purposes.

The same argument which applies for the visible range also applies for the other parts of the near, medium and far electromagnetic spectrum, including infrared. There must obviously be available detectors which can perform the aforesaid functions, i.e. which are sensitive either to an extended band or to various channels contained within the band, according to the case in point.

Each individual channel has a certain information content, which can be analysed alone or connected with logic operations on the content of other channels.

On this basis, a multispectral analysis in the infrared field can be of great use in the most widespread applications.

In the geological field for example, it is known that siliceous rocks have emittence minima which mostly lie between 8 and 14 $\mu$m, depending on the composition. It is therefore apparent that by separating such a band into very narrow channels, a composition analysis can be made remotely.

However, even without making such an extended and technologically complicated separation, good identification can be obtained even by processing the data obtained from relatively larger channels (2.5 $\mu$m), on the basis of the aforesaid.

In the medical field, thermovision is at present carried out in two bands, namely from 3 to 6 $\mu$m or from 7 to 13 $\mu$m according to the sensor used, but it is apparent that, for example, the simultaneous use of the two bands in accordance with the aforesaid pattern can be of valid aid in obtaining a more reliable diagnosis.

Finally, in the agricultural field, the study of pathological states of plants and the analysis of the humus can be made more accurate by the simultaneous use of remote sensing in the visible range, in the near infrared range and in the thermal range.

The methods used up to the present time to obtain multispectral images are essentially of two types.

The first attempt to solve the problem was by dividing the radiation from the observed object into as many bands as the zones of the spectrum of interest either by using partially reflecting mirrors or by separating the various wavelengths with an optical dispersive system (for example as prism), and using various individual detectors sensitive to the different wavelengths.

This solution leads to considerable complication of the optical system. Furthermore, in order to facilitate the processing of the data, it is necessary for the radiation incident on each detector at any moment to originate from the same point of the framed scene, and this requires an extremely accurate assembly.

More recently, a multispectral detector has been constructed constituted by three superimposed HgCdTe photoconductor detector elements. The mercury content of each of these varies, and thus they are sensitive to different radiation bands and are transparent to any band having a wavelength exceeding a so-called "cut-off" value. Consequently, with a suitable arrangement it is possible to detect simultaneously, and without the previously mentioned difficulties, the energy originating from a framed object in different bands of the spectrum, especially if the wavelengths of interest are previously identified.

However, on the other hand, the technology of photoresistors requires that each detector element be insulated from the under lying one at least by a thin layer of epoxy resin, the structure of which causes absorption of the radiation in the bands of interest.

Moreover, photoconductors have precise limits of response speed in operation.

In view of the aforesaid, the object of the present invention is to provide a method which enables multispectral infrared detectors to be constructed which possess the merits of known detectors in the form of three photoconductor elements, but at the same time do not have the aforesaid drawbacks.

As has been possible to verify experimentally, this object has been obtained by a method which, according to the invention, uses the known mercury ion grafting technique for constructing three HgCdTe photovoltaic elements disposed in the form of a sandwich, and comprises the following succession of operations:

(a) preparing, for each of said photovoltaic elements, a slice of HgCdTe having a composition depending on the necessary cut-off wavelength, and a thichness such that it is mechanically self-supporting after operation (c) (e.g. 300–400$\mu$);

(b) polishing both faces of each slice with a diamond paste of progressively decreasing grain size (3-1-0.25 $\mu$m); (c) chemically attacking the polished slices with bromine (20%)-methanol for five minutes in order to eliminate mechanical damage;

(d) heating each slice in the presence of mercury at controlled pressure inside a previously evacuated test tube to define the type of conductivity and the most suitable concentration of the carriers, said heating being carried out in a furnace with a temperature profile such as to enable the slice to be maintained at 400° C. and the mercury at 280° C. for more than ten hours;

(e) constructing the earth contact by catalytic deposition of gold on one face of each slice in accordance with a geometrical arrangement in the form of a circular ring, by using low temperature photolithographic techniques (less than 40° C.);

(f) cementing the individual slices on to respective supports by means of an electrically conducting paste;

(g) depositing a layer of photoresistive material on the entire free face of each slice;

(h) masking said photoresistive layer with the exception of a small exposure region, the dimensions of which vary according to the application scheduled for the detector, and in particular according to the aperture of the inlet optical system of the instrument for which the detector is intended;

(i) eliminating the photoresistive layer in the exposure and development region without exceeding 40° C. during the various stages;

(j) subjecting each slice to grafting under the following conditions: Hg+ ions; E=30 Kev; dose $10^{12}$ ions/cm$^2$;

(k) depositing the upper contact on to each slice by evaporation of indium through a metal mask;

(l) depositing on to said upper contact and on to the grafted region of each slice, an antireflecting layer of ZnS having a thickness compatible with the cut-off wavelengths of the individual photovoltaic elements, and leaving only a region of said upper contact uncovered;

(m) assembling the individual elements constructed in this manner in overlying disposition, making the electrical connection between the upper contact of each photovoltaic element and a respective output terminal of the detector by means of a gold wire welded with electrically conducting paste.

If necessary, high-pass filters of suitable cut-off wavelength can be arranged in the supports of the individual photovoltaic elements.

One example of a multispectral infrared detector obtainable by means of the method according to the invention is illustrated by way of example in the accompanying drawings, in which.

Figure 1:
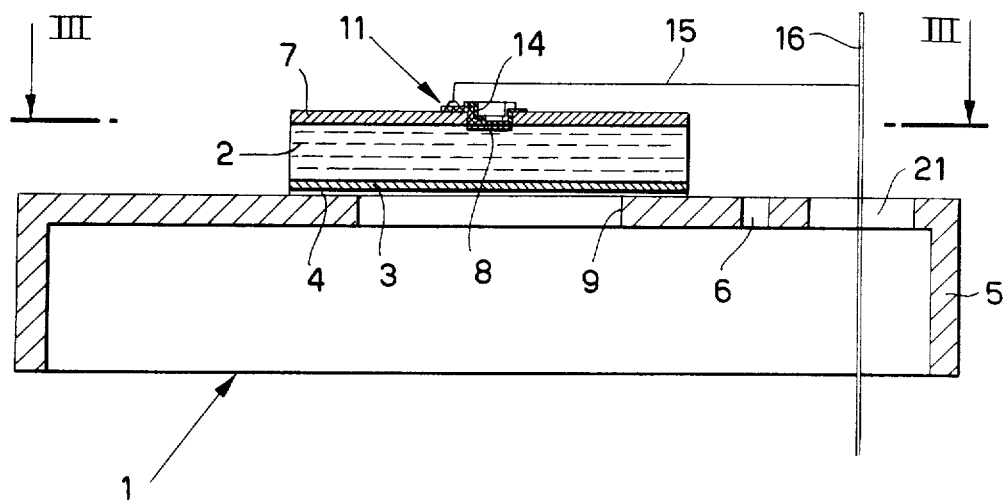
FIG. 1 is a diametrical sectional view of an assembly of the photovoltaic elements which make up the multispectral detector.

The multispectral infrared detector shown on the drawings by way of example is composed of three photovoltaic detector elements 1 constructed as shown in FIGS. 1 to 4.

Each photovoltaic element 1 comprises a cylindrical slice 2 of HgCdTe, to one face of which there is applied a gold earth contact 3 in the form of a circular ring. The assembly comprising the slice 2 and contact 3 is laid and fixed, by means of conducting paste 4 (FIG. 1), on to a metal support 5 (FIGS. 1 and 3) in a position such that the slice 2, contact 3 and a central hole 9 in the support 5 are exactly coaxial. The support 5 is also provided with centering holes 6 and further holes 21.

A layer of photoresist material 7, from which that part of its central region lying above the grafted region 8 of the slice 2 is missing, is laid on the upper face of the slice 2.

Figure 2:
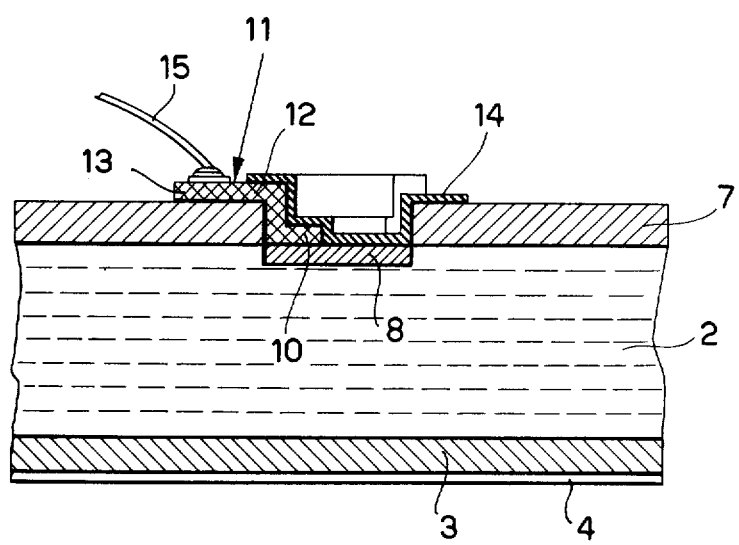
FIG. 2 is a similar sectional view of an enlarged detail of the grafted region of said photovoltaic element.
Figure 3:
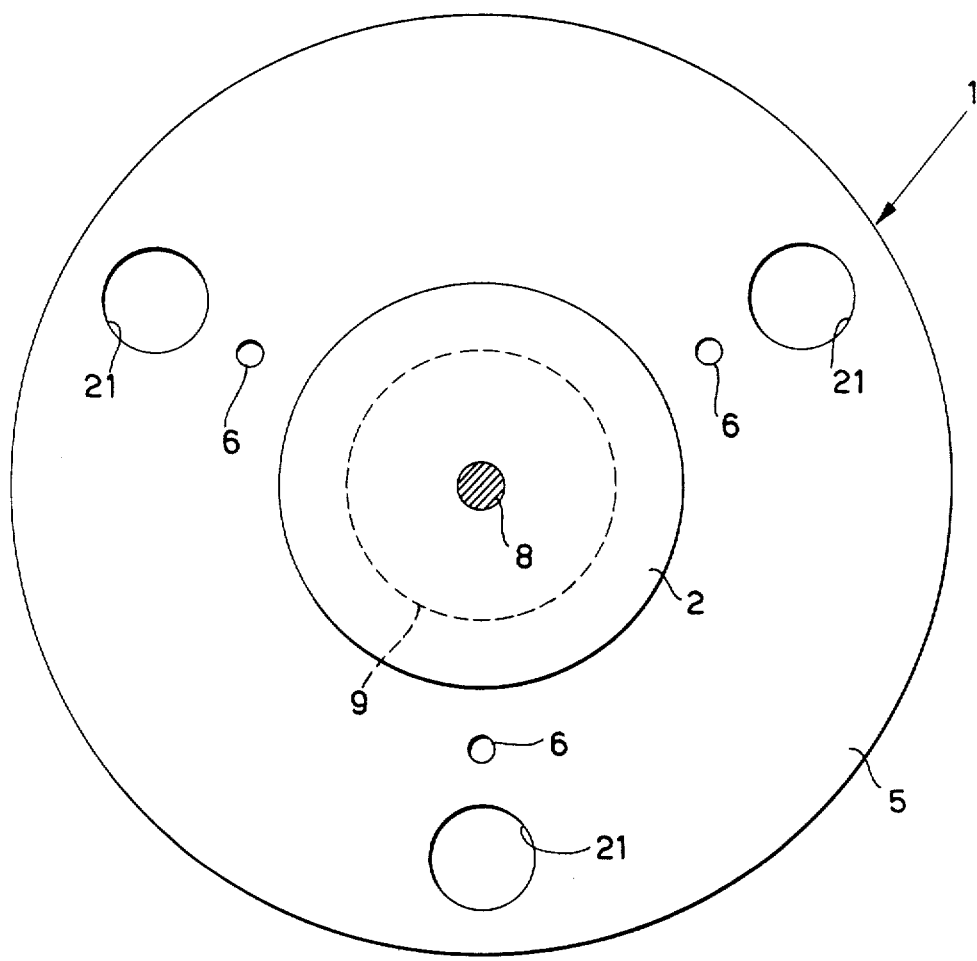
FIG. 3 is a plan section through said photovoltaic element on the line III—III of FIG. 1.
Figure 4:
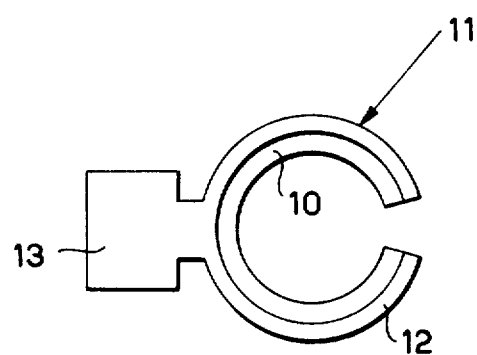
FIG. 4 is a plan view from above of the upper contact of said photovoltaic element.

Into said missing central region of the photoresist layer 7 there is inserted a depressed arcuate part 10 of an upper contact 11 configured as shown in FIGS. 2 and 4, i.e. comprising a further raised arcuate part 12 and a square plate 13 lying on the photoresist layer 7.

The arcuate parts 10 and 12 of the upper contact 11 and the remaining uncovered part of the grafted region 8 are covered with an antireflecting layer 14 of ZnS having a thickness compatible with the required cut-off wavelength.

The plate 13 is left uncovered (FIG. 2), and a gold wire 15 is welded to it to make the electrical contact between said plate 13 and a respective one of three terminals 16 passing through the holes 21.

Figure 5:
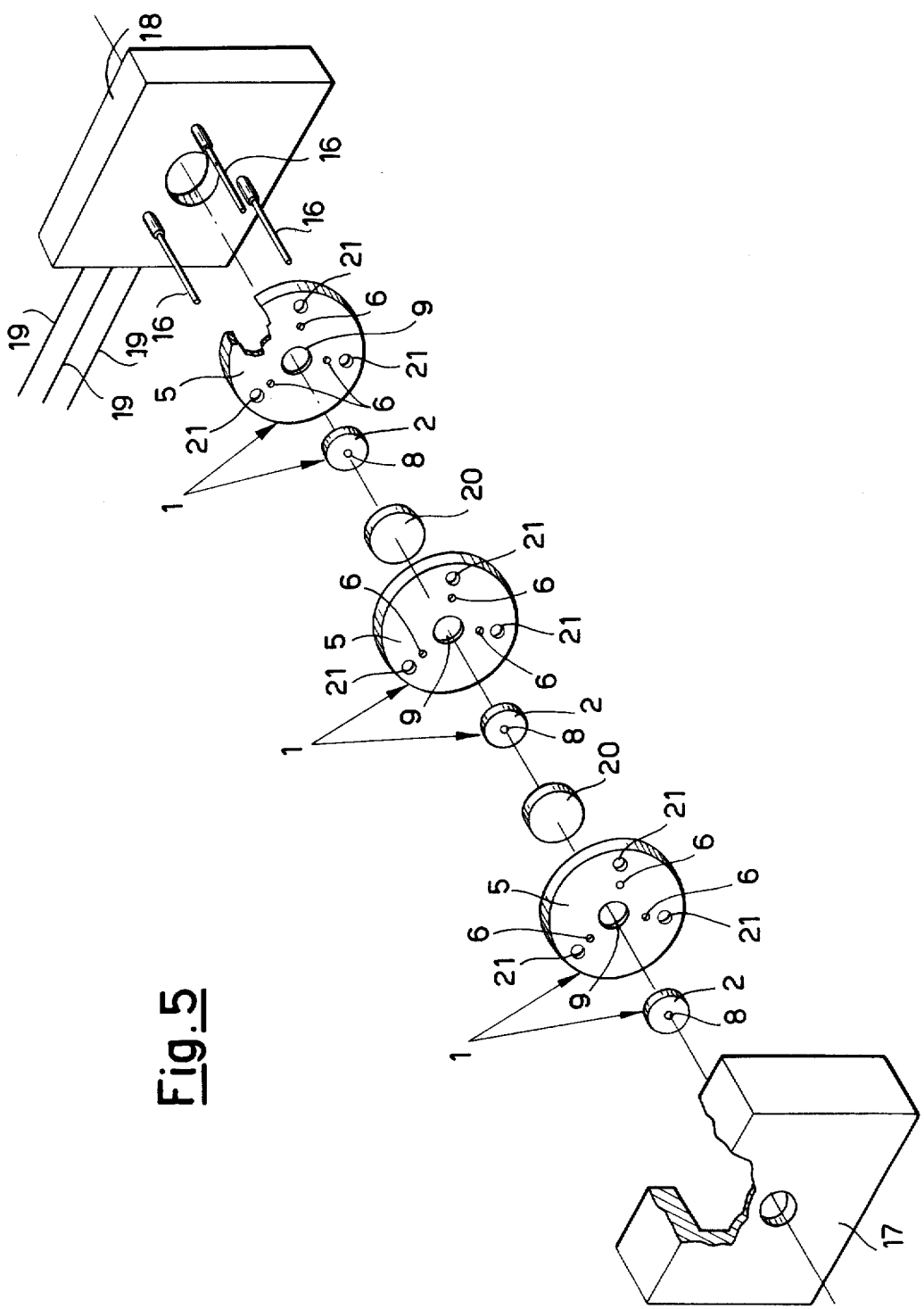
FIG 5 is a perspective exploded view of a multispectral infrared detector constructed by an overlying sandwich arrangement of three photovoltaic elements such as that shown in FIG. 1.

In the assembled multispectral detector (FIG. 5), three photovoltaic elements 1 of the type shown in FIGS. 1 to 4 are superimposed on each other, are centred visually through the holes 6, and are held together between two end shoulders 17 and 18, the first of which acts as a cold screen and the second of which acts as a support terminal which supports the terminals 16 and corresponding external wires 19.

As an option, high-pass filters 20 can be disposed between the various photovoltaic elements 1.

What we claim is:

1. A method for constructing multispectral infrared detectors by forming three photovoltaic HgCdTe elements by the mercury ion grafting technique and superimposing said photovoltaic elements to form a sandwich, and comprising the following succession of operations:

(a) preparing, for each of said photovoltaic elements, a slice of HgCdTe having a composition depending on the necessary cut-off wavelength, and a thickness such that it is mechanically self-supporting after operation (c) (e.g. 300–400μ);

(b) polishing both faces of each slice with a diamond paste of progressively decreasing grain size;

(c) chemically attacking the polished slices with bromine (20%)-methanol for five minutes in order to eliminate mechanical damage;

(d) heating each slice in the presence of mercury at controlled pressure inside a previously evacuated test tube to define the type of conductivity and the most suitable concentration of the carriers, said heating being carried out in a furnace with a temperature profile such as to enable the slice to be mantained at 400° C. and the mercury at 280° C. for more than ten hours;

(e) constructing the earth contact by catalytic deposition of gold on one face of each slice in accordance with a geometrical arrangement in the form of a circular ring, by using low temperature photolithographic techniques (less than 40° C.);

(f) cementing the individual slices on to respective supports by means of an electrically conducting paste;

(g) depositing a layer of photoresistive material on the entire free face of each slice;

(h) masking said photoresistive layer with the exception of a small exposure region, the dimensions of which vary according to the application scheduled for the detector, and in particular according to the aperture of the inlet optical system of the instrument for which the detector is intended;

(i) eliminating the photoresistive layer in the exposure and development region without exceeding 40° C. during the various stages;

(j) subjecting each slice to grafting under the following conditions: $Hg^+$ ions; $E = 30$ Kev; dose $10^{12}$ ions/cm$^2$;

(k) depositing the upper contact on to each slice by evaporation of indium through a metal mask;

(l) depositing on to said upper contact and on to the grafted region of each slice, an antireflecting layer of ZnS having a thickness compatible with the cut-off wavelengths of the individual photovoltaic elements, and leaving only a region of said upper contact uncovered;

(m) assembling the individual elements constructed in this manner in overlying disposition, making the electrical connection between the upper contact of each photovoltaic element and a respective output terminal of the detector by means of a gold wire welded with electrically conducting paste.

2. A method as claimed in claim 1, wherein high-pass filters are inserted between pairs of said photovoltaic elements.

3. A multispectral infrared detector including three photovoltaic elements superimposed in the form of a sandwich, constructed in accordance with the method described in claims 1 or 2.

* * * * *